(12) United States Patent
Suzuki et al.

(10) Patent No.: US 7,403,070 B2
(45) Date of Patent: Jul. 22, 2008

(54) BAND SELECTION TYPE FEED FORWARD AMPLIFIER

(75) Inventors: Yasunori Suzuki, Yokohama (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 231 days.

(21) Appl. No.: 11/445,402

(22) Filed: Jun. 2, 2006

(65) Prior Publication Data

US 2006/0273854 A1 Dec. 7, 2006

(30) Foreign Application Priority Data

Jun. 3, 2005 (JP) ............................. 2005-164386

(51) Int. Cl.
*H03F 1/26* (2006.01)
(52) U.S. Cl. .................................... 330/151
(58) Field of Classification Search .................. 330/151
See application file for complete search history.

(56) References Cited

U.S. PATENT DOCUMENTS

| 4,394,624 | A | 7/1983 | Bauman |
| 5,854,811 | A | 12/1998 | Sasaki |
| 6,066,984 | A | 5/2000 | Tomaru et al. |
| 6,208,204 | B1 | 3/2001 | Suzuki et al. |
| 6,320,464 | B1 | 11/2001 | Suzuki et al. |
| 6,392,483 | B2 | 5/2002 | Suzuki et al. |
| 6,400,223 | B1 | 6/2002 | McLaren |
| 6,456,160 | B1 * | 9/2002 | Nakayama et al. ............ 330/52 |
| 6,515,544 | B1 | 2/2003 | Suzuki et al. |
| 6,566,945 | B2 * | 5/2003 | Nakayama et al. ............ 330/52 |
| 6,838,934 | B2 | 1/2005 | Suzuki et al. |
| 2004/0189384 | A1 | 9/2004 | Kemna |
| 2005/0163254 | A1 | 7/2005 | Suzuki et al. |

FOREIGN PATENT DOCUMENTS

| JP | 1-198809 | 8/1989 |
| JP | 2000-236222 | 8/2000 |

OTHER PUBLICATIONS

U.S. Appl. No. 11/445,183, filed Jun. 2, 2006, Suzuki et al.
U.S. Appl. No. 11/445,402, filed Jun. 2, 2006, Suzuki et al.

* cited by examiner

*Primary Examiner*—Marvin M. Leteef
*Assistant Examiner*—Khiem D Nguyen
(74) *Attorney, Agent, or Firm*—Oblon, Spivak, McClelland, Maier & Neustadt, P.C.

(57) ABSTRACT

The present invention has for its object to provide, in an environment where plural radio systems coexist, a feed forward amplifier capable of adaptively selecting a frequency band. The feed forward amplifier of the present invention comprises a distortion detection circuit and a distortion elimination circuit and has n first vector adjusters 4 which have different operating frequency bands and are inserted in a first vector adjustment path 14 of the distortion detection circuit; and n second vector adjusters 11 which have frequency bands corresponding to those of first vector adjusters 4 and are inserted in a second vector adjustment path 8 of the distortion elimination circuit. By means of a first switching means 3 selecting one first vector adjuster 4 and a second switching means 10 selecting a second vector adjuster 11, the frequency band for which distortion component is compensated in the feed forward amplifier is controlled by switching.

5 Claims, 10 Drawing Sheets

BAND SELECTION TYPE FEED FORWARD AMPLIFIER

BACKGROUND OF THE INVENTION

1. Field of the Invention

This invention pertains to a transmission amplifier for radio communications which adaptively changes the frequency band. In particular, it pertains to a band selection type feed forward amplifier for multiple frequency bands which selects and amplifies an arbitrary frequency band from among a plurality of frequency bands.

2. Description of Related Art

The base configuration of a feed forward amplifier is shown in FIG. 1. The feed forward amplifier includes two signal processing circuits. One is a distortion detection circuit 100 and the other is a distortion elimination circuit 101. Distortion detection circuit 100 is composed of a main amplifier signal path 103 and a linear signal path 104. Distortion elimination circuit 101 is composed of a main amplifier output signal path 108 and a distortion injection path 109. Main amplifier signal path 103 (also called a vector adjustment path) is composed of a vector adjuster 105 and a main amplifier 106. Vector adjuster 105 has a variable phase shifter 105a and a variable attenuator 105b. Linear signal path 104 is composed of delay lines. Also, main amplifier output signal path 108 is composed of delay lines. Distortion injection path 109 is composed of a vector adjuster 110 and an auxiliary amplifier 111. Vector adjuster 110 is composed of a variable phase shifter 110a and a variable attenuator 110b. A divider 102, a power combiner/divider 107, and a power combiner 112 are simple lossless power dividers and power combiners composed of transformer circuits, hybrid circuits, and the like.

First, an explanation of the basic operation of the feed forward amplifier will be given. The signal input into the feed forward amplifier is divided into main amplifier signal path 103 and linear signal path 104 by means of divider 102. At this point, variable phase shifter 105a and variable attenuator 105b of main amplifier signal path 103 are adjusted so that the signals of main amplifier signal path 103 and linear signal path 104 have equal amplitude and opposite phase. As methods for bringing the paths to opposite phases, there is the method wherein power divider 102 or power combiner/divider 107 sets a phase shift quantity appropriately between the input and output terminals or the method wherein main amplifier 106 inverts the phase.

Since distortion detection circuit 100 is configured in this way, power combiner/divider 107 can output the differential component of the signal passing through main amplifier signal path 103 and the signal passing through linear signal path 104. This differential component is precisely the distortion component generated in main amplifier 106. Due to this fact, the block from power divider 102 to power combiner/divider 107 shown in FIG. 1 is called a distortion detection circuit.

Next, an explanation regarding distortion elimination circuit 101 will be given. The output of distortion elimination circuit 100 is divided, via power combiner/divider 107, into main amplifier output signal path 108 and distortion injection path 109. The output of main amplifier 106 from main amplifier signal path 103 (the signal passing through main amplifier signal path 103) is input into main amplifier output signal path 108. Also, the distortion component of main amplifier 106 detected in distortion detection circuit 100 (the differential component of the signal passing through main amplifier signal path 103 and the signal passing through linear signal path 104) is input into distortion injection path 109. As for variable phase shifter 110a and variable attenuator 110b of distortion injection path 109, the distortion component of the signal passing through main amplifier output signal path 108 and the signal passing through distortion injection path 109 are adjusted so as have equal amplitude and opposite phase. By making an adjustment in this way, power combiner 112 can combine the signal passing through main amplifier signal path 103 with the distortion component of main amplifier 106 having equal amplitude and opposite phase. And then, power combiner 112 outputs a signal in which the distortion components of the whole amplifying circuit are cancelled. Further, even if it is a matter of common knowledge, a linear amplifier is used as an auxiliary amplifier in order to eliminate the distortion component generated in the main amplifier used in a feed forward amplifier. The aforementioned operation is an ideal operation of a feed forward amplifier. In practice, it is not simple to completely maintain a balance of the distortion detection circuit and the distortion elimination circuit. Also, even if tentatively the initial settings are perfect, since the properties of the amplifier change due to fluctuations in ambient temperature, power supply, and the like, it is extremely difficult to preserve an excellent balance which is stable over time.

As a method for maintaining with high accuracy a balance of the distortion detection circuit and the distortion elimination circuit of this feed forward amplifier, there is known an self-adjusting method using a pilot signal. E.g., there exist the Japanese Patent Application Laid-Open Publication No. 1 (1989)-198809 (Patent Reference 1) and the like. As devices putting these methods into practical use, there is known the article "Extremely Low-Distortion Multi-Carrier Amplifier For Mobile Communication Systems-Self-adjusting Feed-Forward Amplifier (SAFF-A)" by Toshio Nojima and Shoichi Narahashi, Institute of Electronics, Information, and Communication Engineers, Wireless Communication Systems Society, RCS90-4, 1990 (Non-patent Reference 1). These feed forward amplifiers were put into practice in the 800 MHz band and the 1.5 GHz band of the PDC (Personal Digital Cellular) mobile communications standard in Japan. This kind of feed forward amplifier is generally designed and adjusted to amplify separately for each frequency band.

In the radio systems developed this far, a single system in accordance with any one of PDC, GSM (Global System for Mobile communications), IMT-2000 (International Mobile Telecommunications 2000), and the like, was used. As against this, there is the technology of carrying out a transfer to software of some functionality of radio devices so that it becomes possible for a single hardware to handle a plurality of radio systems. If it is possible for a single hardware to handle a plurality of radio systems, the user can use the mobile communication environment without any awareness of the radio system or the core network in the background thereof. However, a single hardware actually handling a plurality of radio systems is something that has not reached implementation.

Also, it can be considered that, for each region or operator, the services offered with the radio system will be different and that the radio systems will also gradually become diversified. For this reason, it can be considered that, in the future, there will arise a need to make radio systems coexist which are optimal for each purpose, at the same time and in the same place.

As a method of using these plural radio systems, there is the multiband radio system. This radio system adaptively changes the frequency band used or the number of frequency bands used in response to the propagation environment and the traffic conditions. Also, in order to ensure a prescribed transmission quality or transmission volume, multiband transmission using frequency bands not in use is effective. Consequently, in a multiband radio system, in order to ensure the transmission quality or transmission volume to be guaranteed by the same radio system, the number of frequency bands is changed. Moreover, changes are also carried out in the same way within the same frequency band. Further, a multiband radio system, in case there coexist frequency bands used by several operators, can raise the frequency utilization efficiency by carrying out adaptive control using available frequency bands by means of interference recognition technology, frequency sharing technology, interference cancellation technology, produced interference reduction and avoidance technology, multiband control technology, and the like.

The feed forward amplifier is used as a linear amplifier for base stations handling multiband radio systems like this. However, in case the plural frequency bands to be amplified are widely separated, compared to the bandwidth of each frequency band, the adjustment levels of the variable phase shifter and the variable attenuator for keeping the balance of the distortion detection circuit and the distortion elimination circuit within a prescribed range vary with the frequency band to be amplified, because the electrical length of the delay line for each frequency band differs.

To put it in concrete terms, in case a delay line is used in common for all frequency bands, there is, due to the frequency differences of the input signals, ordinarily a need for the setting value of the vector adjuster to track a signal rotating with the angular velocity of the frequency difference. However, in the vector adjusters developed this far, it has not been possible to track a signal rotating at a velocity like that. Also, as for the vector adjusters discussed this far, it has not been possible to simultaneously set an optimal amplitude and phase, with respect to plural input signals, for structural reasons.

E.g., in case 800 MHz band and 1.5 GHz band signals are input into the same vector adjuster, it is possible to carry out optimal vector adjustment with respect to any one of the frequency bands. However, it is not possible to carry out optimal vector adjustment which tracks a frequency difference of 700 MHz. Consequently, the conventional feed forward amplifier has not been able to simultaneously amplify the 800 MHz band signal and the 1.5 GHz band signal at or below a prescribed distortion compensation level.

As a method of resolving this, a dual-band feed forward amplifier is proposed in the article "Dual-band Feed Forward Amplifier" by Yasunori Suzuki and Shoichi Narahashi, the 2005 General Meeting of the Institute of Electronics Information and Communication Engineers, C-2-2, March 2005 (Non-patent Reference 2). With this configuration, there is provided a vector adjuster having a band extraction means for each frequency band. In other words, this dual-band feed forward amplifier extracts the signal of the vector adjusted frequency band from the signals of two frequency bands input by means of a filter provided in a pre-stage of the vector adjuster. And then, vector adjustment is carried out for each frequency band. This dual-band feed forward amplifier configuration is capable of distortion compensation in a plurality of frequency bands. Further, the compensated band is fixed by the filter.

In multiband radio systems having a plurality of transmission bands, it can be considered to change the frequency band due to the service situation of the radio system, interference of other radio systems, and the like. However, as mentioned above, the bandwidth of the distortion compensation of the feed forward amplifier is determined by the adjustment accuracy of each loop of the distortion detection circuit and the distortion elimination circuit. Consequently, in the conventional feed forward amplifier, the adjustment of distortion compensation could not be made to correspond with the frequency band changes. Nor was it possible for the conventional dual-band feed forward amplifier in which the distortion compensated frequency band was fixed to adaptively change the operating frequency. For a feed forward amplifier used over a long time, the change in frequency band accompanies repairs or a change of the feed forward amplifier in the base station. Consequently, an enormous amount of labor and time is required to readjust a large number of feed forward amplifiers. A feed forward amplifier configuration making this kind of labor and time expense unnecessary was required.

E.g., in case, for a dual-band feed forward amplifier which simultaneously compensated the distortion of a signal in a frequency band f1 and a signal in a frequency band f2, the frequency band was changed from f2 to f3, it was not possible to simultaneously compensate the distortion of the signal in frequency band f1 and the signal in frequency band f3. This was so because loop adjustment by the frequency difference of f1 and f3 was not possible, as mentioned above, due to the fact that the operating frequencies of a conventional dual-band feed forward amplifier are fixed.

Also, there can be considered the method of providing, in the dual-band feed forward amplifier, fixed filters and vector adjusters handling all the frequency bands that may be thought to be available for future service. However, having fixed filters and vector adjusters able to handle all the frequency bands amounts to having fixed filters and vector adjusters which are not used something which runs counter to configuring an economical feed forward amplifier. There was demanded a feed forward amplifier with no need for the exchange of constituent parts and having no redundancy to accompany in this way the changes in frequency band or the increase and/or decrease in the number of carrier waves.

BRIEF SUMMARY OF THE INVENTION

The present invention pertains to a feed forward amplifying comprising a distortion detection circuit and a distortion elimination circuit. In a first vector adjustment path of the distortion detection circuit, there are provided in parallel n vector adjusters respectively having different operating frequency bands. Also, in a second vector adjustment path of the distortion elimination circuit, there are provided in parallel n second vector adjusters whose frequency bands correspond to the operating frequency bands of the first vector adjusters. Further, the amplifying device comprises a first switching means selecting one out the n first vector adjusters and a second switching means selecting a second vector adjuster having the same operating frequency band as the selected first vector adjuster. And then, there is provided a frequency controlling part adaptively switching and controlling the first and the second switching means.

According to the present invention, it is possible, for each frequency band of the feed forward amplifier input signals, to use a vector adjuster suitable for the same frequency band. Consequently, distortion compensation optimal for each frequency band can be performed. Also, even in a communications environment in which plural radio systems coexist, it becomes possible to adaptively change the operating frequency band of the feed forward amplifier.

In this way, the feed forward amplifier of the present invention is capable of linearly amplifying a frequency band corresponding to the service situation of the radio system. Consequently, the present invention can render unnecessary additional equipment accompanying a change in the frequency band or an increase in carrier waves. Also, in the prior art, it was imperative to install a plurality of feed forward amplifiers having different operating frequency bands in the base station, but according to the present invention, since it is acceptable to install a single feed forward amplifier, the invention is advantageous from the viewpoints of device scale and power consumption.

DETAILED DESCRIPTION OF THE INVENTION

1. First Embodiment

Figure 1:
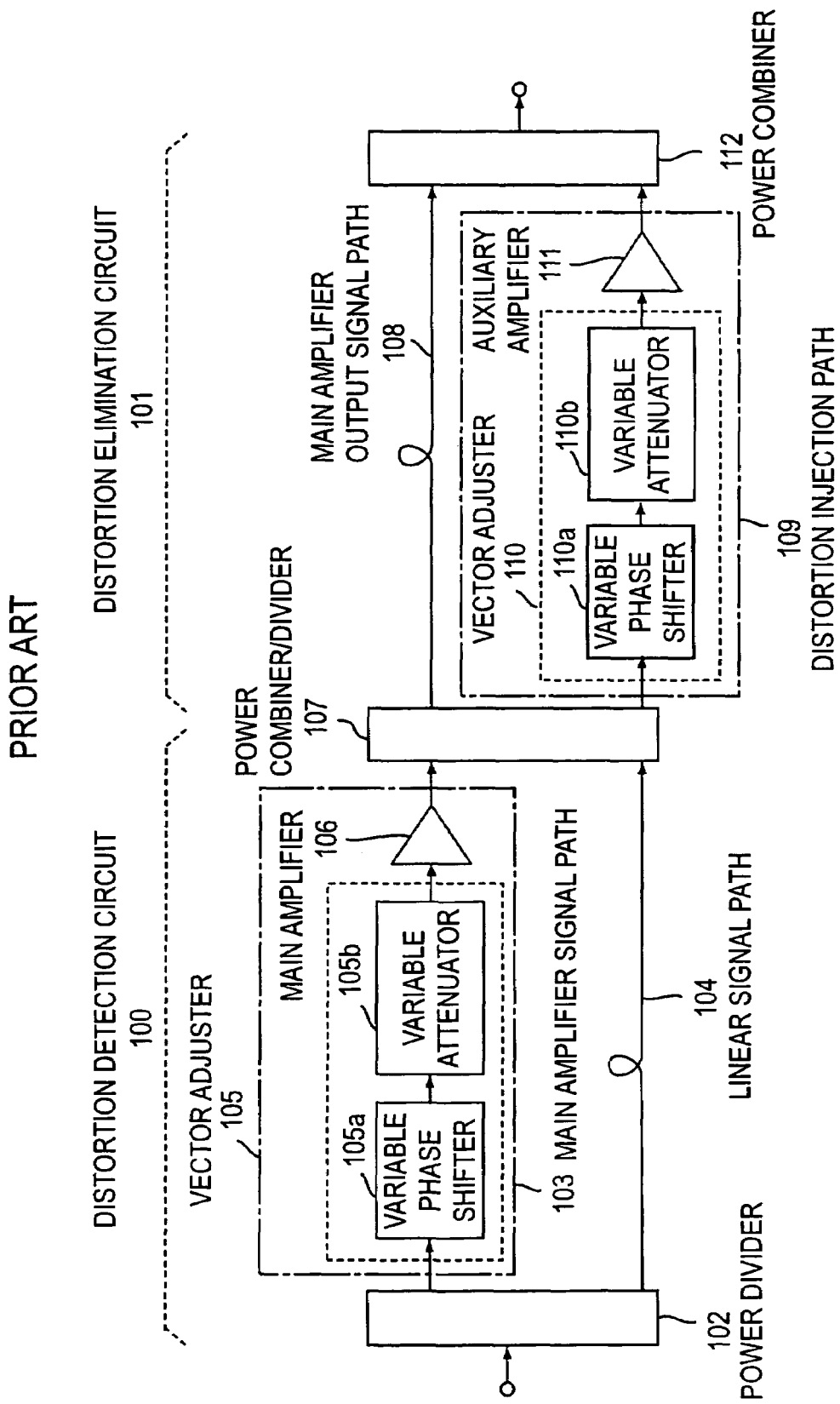
FIG. 1 is a diagram showing the basic configuration of a conventional feed forward amplifier.
Figure 2:
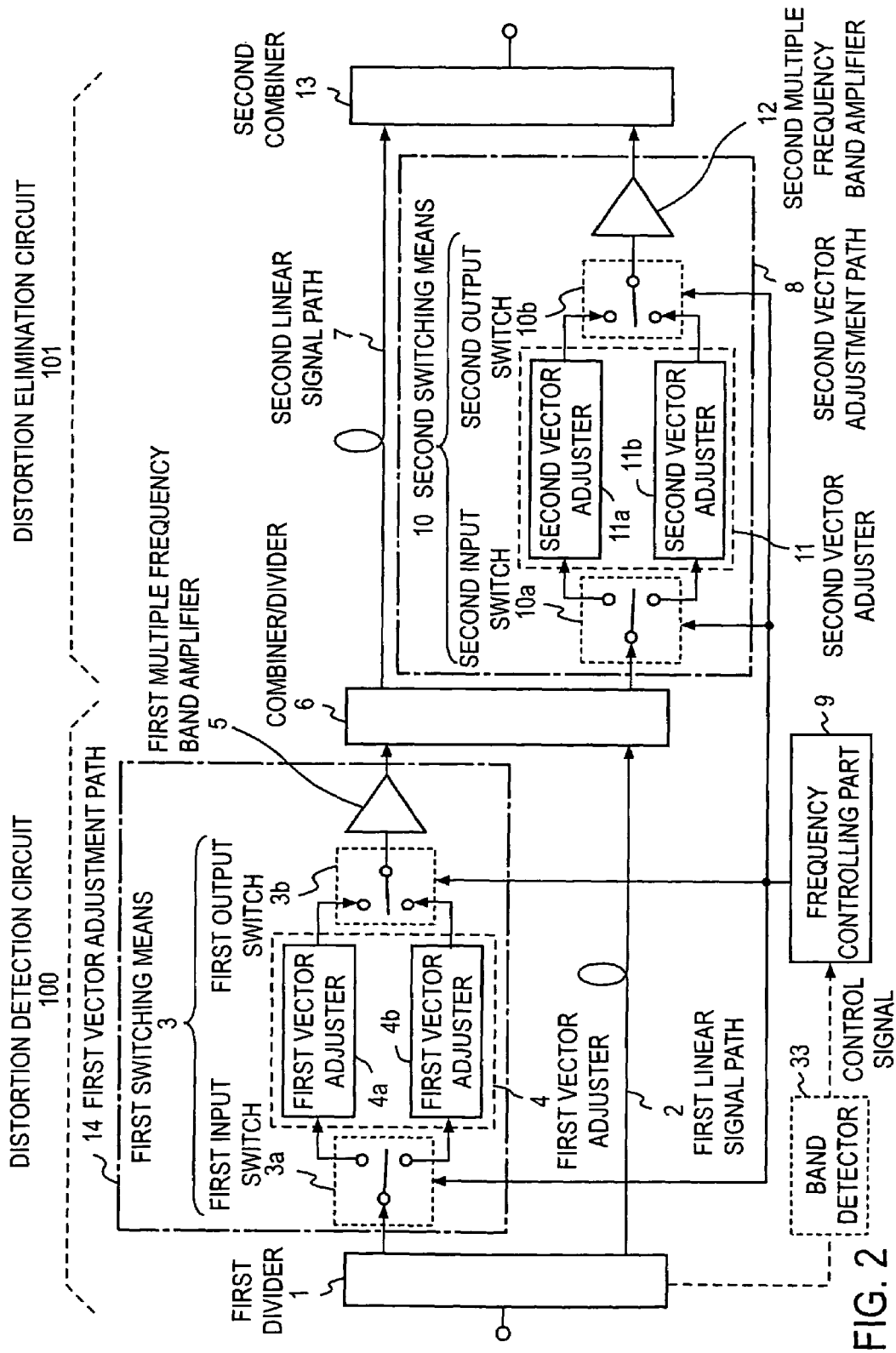
FIG. 2 is a diagram showing the fundamental configuration of a feed forward amplifier of this invention.

In FIG. 2, there is shown the basic configuration of a feed forward amplifier of the present invention. The feed forward amplifier of the present invention comprises a distortion detection circuit 100, a distortion elimination circuit 101, and a frequency controlling part 9. Distortion detection circuit 100 includes a first linear signal path 2 and a first vector adjustment path 14. Distortion elimination circuit 101 includes a second linear signal path 7 and a second vector adjustment path 8. First vector adjustment path 14 is composed of a series connection of a first switching means 3 and a first multiple frequency band amplifier 5. First switching means 3 is composed of a first input switch 3a, n first vector adjusters 4, and a first output switch 3b. The n first vector adjusters 4, which have respectively different operating frequency bands, are arranged in parallel.

Second vector adjustment path 8 is composed of a series connection of a second switching means 10 and a second multiple frequency band amplifier 12. Second switching means 10 is composed of a second input switch 10a, n second vector adjusters 11, and a second output switch 10b. The n second vector adjusters 11, the operating frequencies of which correspond respectively to those of the first vector adjusters, are arranged in parallel. In FIG. 2, in order to simplify the explanation, first switching means 3 is taken to be a Single Pole Double Throw (SPDT) switch. Also, first vector adjuster 4 is composed of two vector adjusters 4a and 4b capable of adjusting the amplitude and phase of signals in two different frequency bands. However, there is no need for the number of vector adjusters to be limited to 2, the aforementioned n being an integer equal to or greater than 2.

A first divider 1 distributes the input signal for the feed forward amplifier to first linear signal path 2, constituted by a delay line, and first vector adjustment path 14. Frequency controlling part 9, following a control signal from an operations center, switches first input switch 3a, first output switch 3b, second input switch 10a, and second output switch 10b. E.g., in case first vector adjuster 4a and second vector adjuster 11a are connected, the signal divided by means of first divider 1, is input by means of first vector adjustment path 14 into first vector adjuster 4a. First vector adjuster 4a adjusts the phase of the input signal and outputs it. First multiple frequency band amplifier 5 amplifies the output of first vector adjuster 4a. By proceeding in this way, first vector adjuster 4a and first multiple frequency band amplifier 5 adjust the signal which is input to first vector adjustment path 14, on the input side of combiner/divider 6, to a signal having opposite phase and equal amplitude with respect to the signal passing through first linear signal path 2. If adjustment is carried out in this way, the distortion component generated by first multiple frequency band amplifier 5 is obtained by acquiring the differential component of first linear signal path 2 and first vector adjustment path 14. Combiner/divider 6 outputs the signal, with the distortion component generated by first multiple frequency band amplifier 5 left added to the transmitted signal, to second linear signal path 7 of distortion elimination circuit 101. Also, combiner/divider 6 outputs the distortion component, which is the differential component of first linear signal path 2 and first vector adjustment path 14, to second vector adjustment path 8 of the distortion elimination circuit. In second vector adjustment path 8, second vector adjuster 11a adjusts the phase of the distortion component and outputs it. Second multiple band frequency amplifier 12 amplifies the output of second vector adjuster 11a. By proceeding in this way, second vector adjuster 11a and second multiple frequency band amplifier 12 adjust the distortion component input into second vector adjustment path 8 on the input side of second combiner 13 to a signal having opposite phase and equal amplitude with respect to the distortion component included in the signal passing through second linear signal path 7. Since the phase and amplitude of the distortion component are adjusted in this way, the distortion component is cancelled if second combiner 13 combines the signal passing through second linear signal path 7 and the signal passing through second vector adjustment path 8.

As mentioned above, first input switch 3a, first output switch 3b, second input switch 10a, and second output switch 10b are controlled by frequency controlling part 9. In case first vector adjuster 4a is chosen to be for the 800 MHz band and first vector adjuster 4b is chosen to be for the 1.5 GHz band, second vector adjuster 11a may be chosen to be for the 800 MHz band and second vector adjuster 11b also may be chosen for the 1.5 GHz band. When first switching means 3 selects the 800 MHz band vector adjuster 4a by means of frequency controlling part 9, the 800 MHz band vector adjuster 11a is also selected, by second switching means 10.

A distinguishing feature of this invention is that, in case the used frequency band is changed, distortion compensation suitable for the used frequency band is performed by connecting the vector adjuster for the corresponding frequency band to the distortion detection circuit and the distortion elimination circuit.

Figure 3:
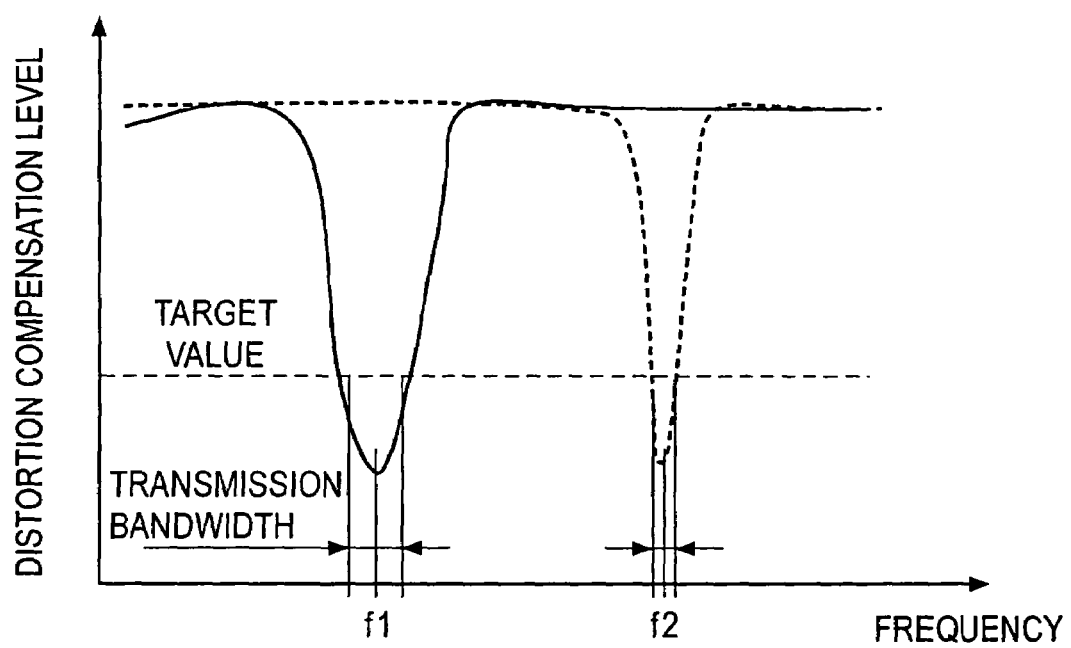
FIG. 3 is a diagram showing a conceptual diagram of distortion compensation.

In FIG. 3, the distortion compensation concept is shown. The abscissa axis of FIG. 3 indicates frequency and the ordinate axis indicates the level of distortion compensation. When the operating center frequency of first vector adjustment path 14 and second vector adjustment path 8 is f1, the distortion of signals centered on frequency f1 is compensated. If first vector adjuster 4a and second vector adjuster 11a are for frequency band f1, first input switch 3a, first output switch 3b, second input switch 10a, and second output switch 10b may be set on the sides of first vector adjuster 4a and second vector adjuster 11a, respectively. By compensating for the distortion, the distortion level with respect to e.g. the signal amplitude of the signal band is reduced by something like −30 dB.

If the operating center frequency of first vector adjustment path 14 and second vector adjustment path 8 is changed to f2, distortion compensation in the frequency band centered on frequency f2 is carried out. If first vector adjuster 4b and second vector adjuster 11b are for frequency band f2, first input switch 3a, first output switch 3b, second input switch 10a, and second output switch 10b may be set on the sides of first vector adjuster 4b and second vector adjuster 11b. By making the settings in that way, the range of distortion compensated frequencies becomes frequency band f2. In FIG. 3, the bandwidth of frequency f2 is narrower than that of frequency f1. In this way, it is possible to set the center frequency and the bandwidth of the frequency band for which distortion compensation is carried out by means of first vector adjuster 4 and second vector adjuster 11.

As mentioned above, the feed forward amplifier of the present invention can switch and connect vector adjusters with different operating frequency bands to vector adjustment paths. Consequently, the feed forward amplifier of the present invention can compensate the distortion component of transmitted signals in a plurality of frequency bands. Further, in the aforementioned explanation, an explanation was given of an example in which SPDT switches were used for first switching means 3 and second switching means 10. However, by taking a single pole n-throw switch having n contact points and providing n vector adjusters with respectively different operating frequency bands, it is possible to perform distortion compensation with high accuracy with respect to n frequency bands. In order to handle e.g. the 800 MHz, 1.5 GHz, 2.0 GHz, 2.4 GHz, and 5.2 GHz radio systems and the like, vector adjusters may be provided for each frequency band. Even in a radio system of this kind adaptively selecting a large number of frequency bands, the feed forward amplifier of the present invention carries out sufficient distortion compensation and yet can be implemented with a comparatively small hardware scale and software scale.

Variation

Figure 4:
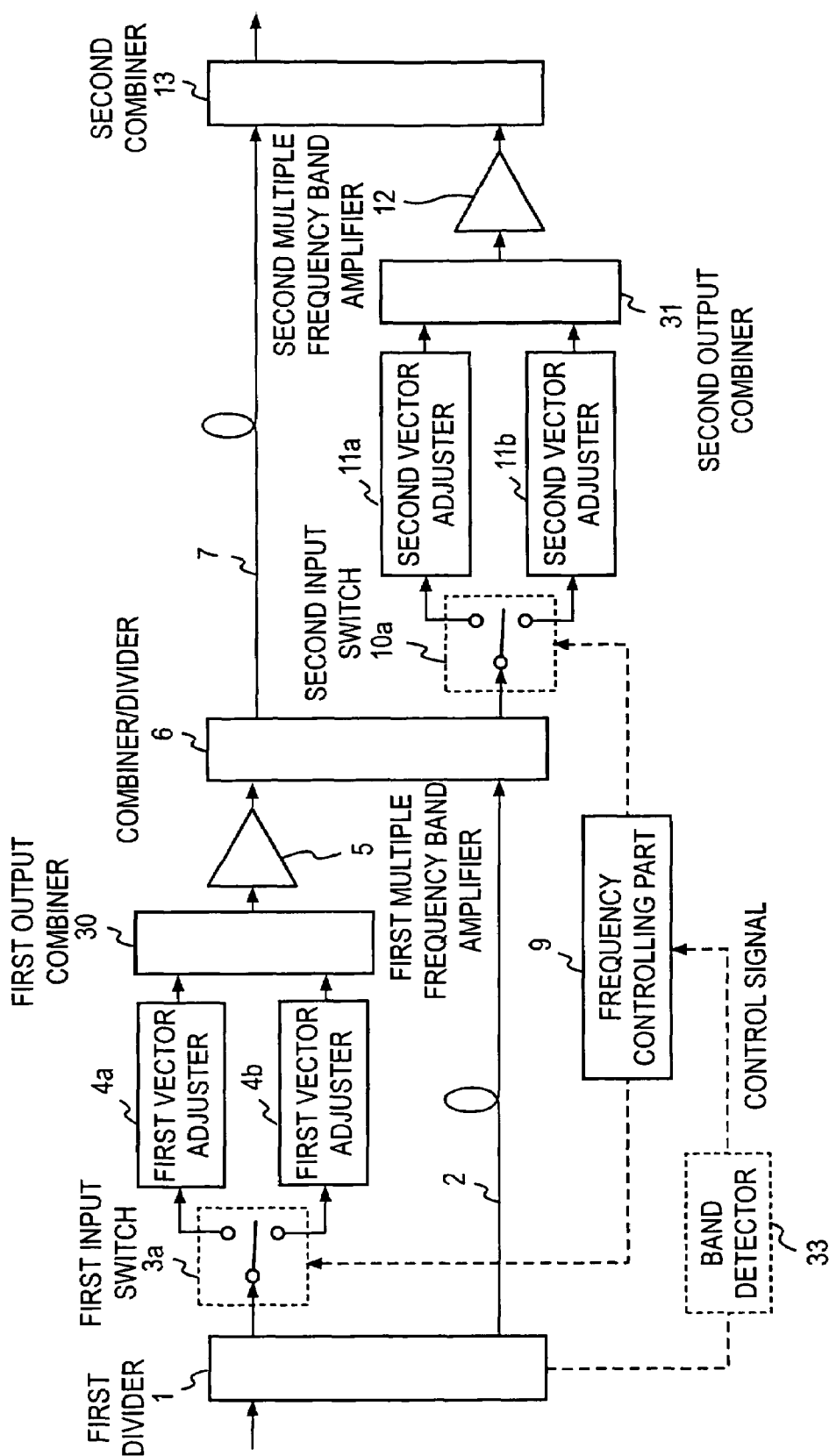
FIG. 4 is a diagram showing the first embodiment of this invention.

In FIG. 4, there is shown a variation of Embodiment 1 in which the first and the second switching means are constituted by an output combiner combining the output signals of one input switch and a plurality of vector adjusters. The output terminals of first vector adjusters 4a and 4b are connected to a first output combiner 30. The output terminal of first output combiner 30 is connected to the input terminal of first multiple frequency band amplifier 5.

The output terminals of second vector adjusters 11a and 11b are connected to a second output combiner 31. The output terminal of second output combiner 31 is connected to the input terminal of second multiple frequency band amplifier 12. First output combiner 30 and second output combiner 31 can be implemented with e.g. the well-known Wilkinson power combiner, a 3 dB hybrid circuit, or the like. In this way, it is possible to replace the first and second output switches of the first and second switching means with combiners.

2. Second Embodiment

Figure 5:
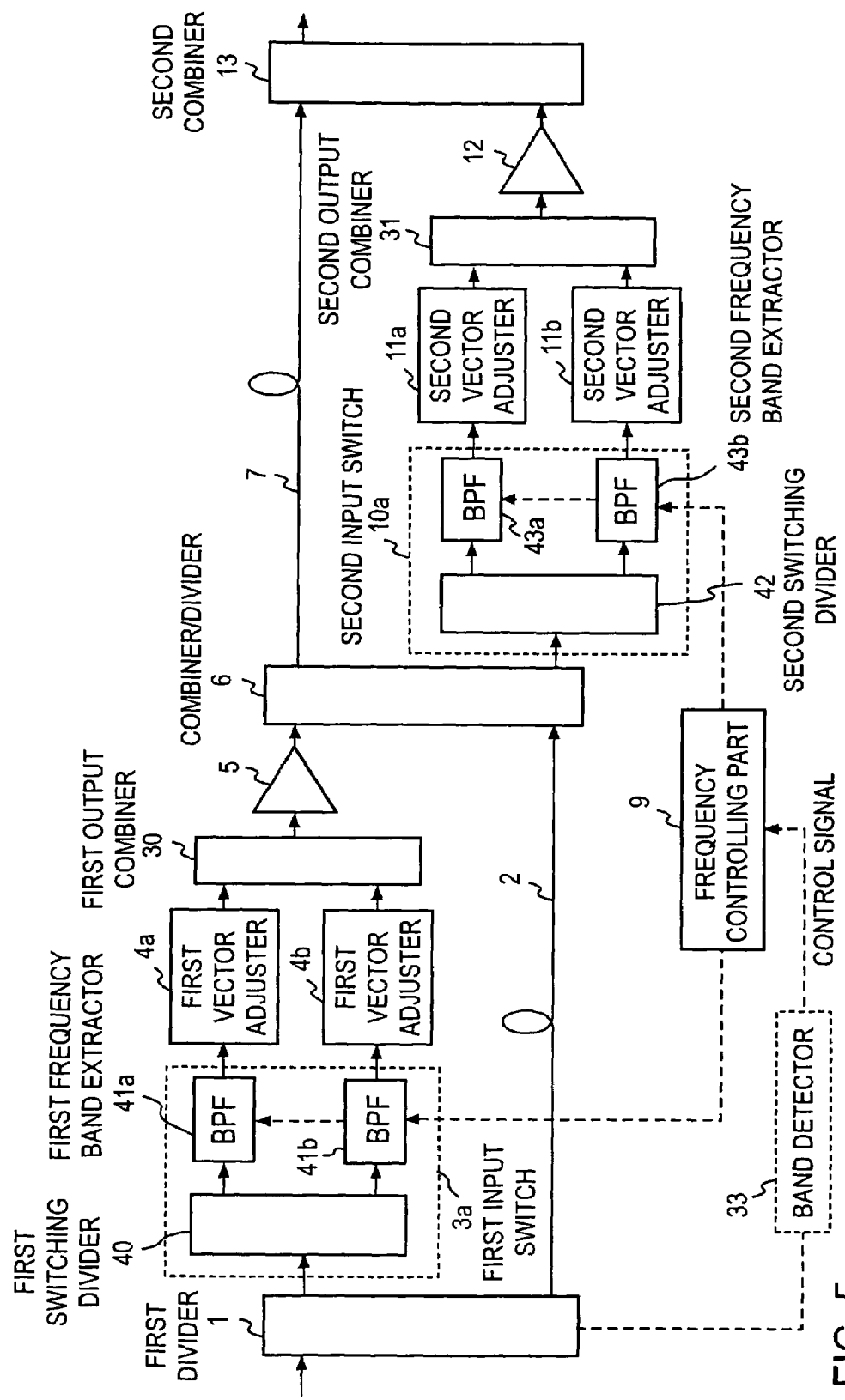
FIG. 5 is a diagram showing the second embodiment of this invention.

In FIG. 5, an example is shown wherein the input switch is composed of a switch divider and frequency band extractors. The signal divided by first divider 1 is input to a first switching divider 40. First switching divider 40 distributes the input signal to first frequency band extractors 41a and 41b. First frequency band extractors 41a and 41b are constituted by band pass filters or band elimination filters. In these filters, the frequencies of respectively different frequency bands, e.g. the 800 MHz band and the 1.5 GHz band, are extracted and output to first vector adjusters 4a and 4b.

In second switching means 10 as well, the distortion component from combiner/divider 6 is input to a second switching divider 42. Second switching divider 42 distributes the input signal to second frequency band extractors 43a and 43b. Second frequency band extractors 43a and 43b extract frequencies of respectively different frequency bands, e.g. the 800 MHz band and the 1.5 GHz band, and output them to second vector adjusters 11a and 11b.

Which of first frequency band extractors 41a and 41b and second frequency band extractors 43a and 43b should be operated is selected by frequency controlling part 9. E.g., in case of compensating for the distortion component of a transmitted signal in the 800 MHz band, first frequency band extractor 41a and second frequency band extractor 43a are selected.

In FIG. 5, an example has been shown in which there are two frequency band extractors each, but it is also possible to make the system capable of handling n frequency bands by providing n extractors in parallel.

In case each frequency band extractor is constituted by a band pass filter, it is easy to extract the band periphery of the center frequency, so there is the advantage that it is comparatively simple to obtain isolation from the center frequency. However, since the center frequency works out to the resonance frequency of the band pass filter, the signal delay becomes long. Consequently, there is a need to adapt to the same delay quantity by increasing the line length of the delay line constituting the linear signal path.

Moreover, if each frequency band extractor is constituted by a band rejection filter, since the extracted frequency band is not the center frequency of the band elimination filter, the delay quantity of the passed frequency band is small. Consequently, there is the advantage that the line length of the linear signal path can be made short and with low loss. Further, there is also the characteristic that the design of band rejection filters is straightforward.

3. Third Embodiment

Figure 6:
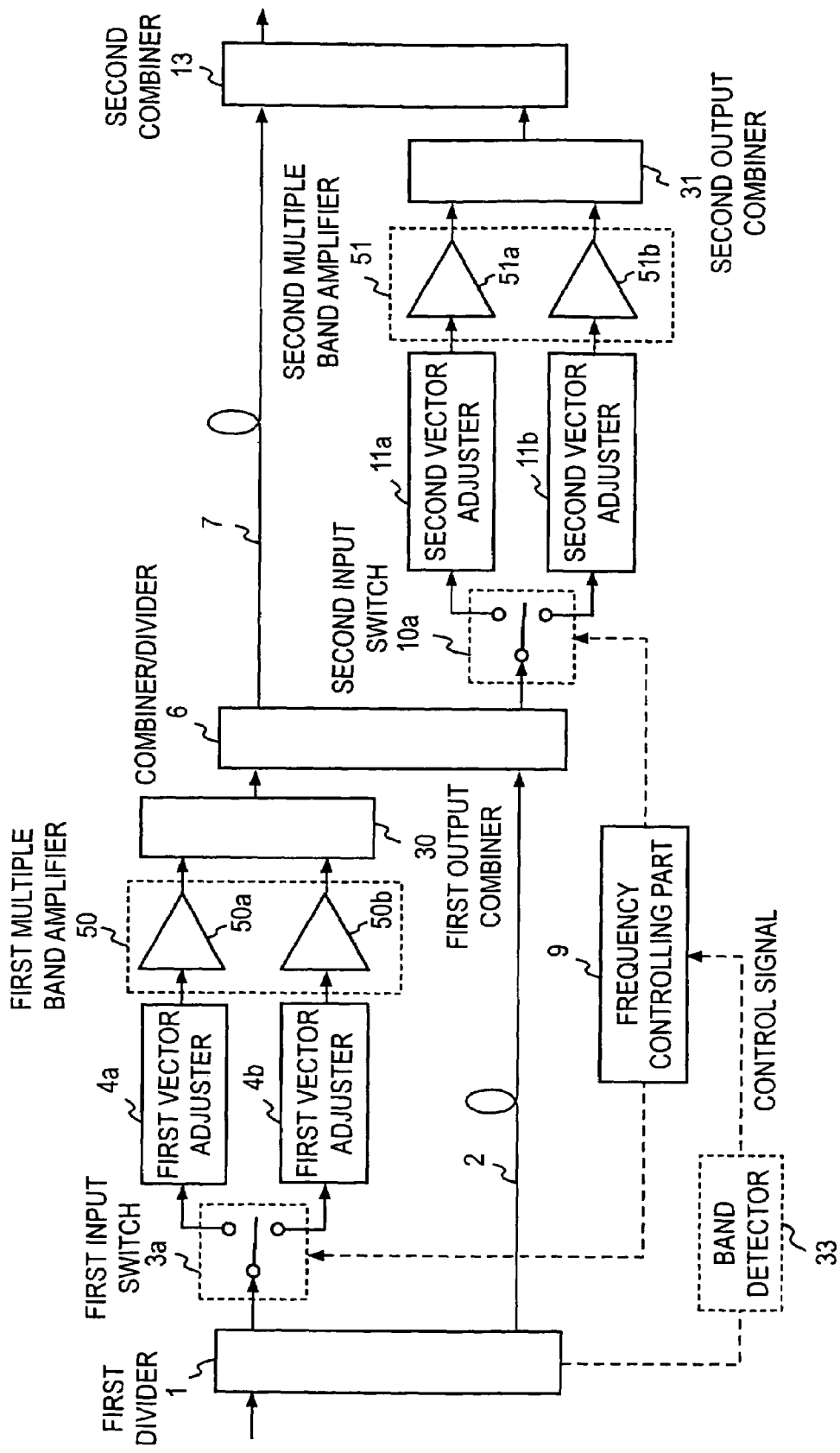
FIG. 6 is a diagram showing the third embodiment of this invention.

In FIG. 6, an example is shown in which individual amplifiers are provided, as a first multiple frequency band amplifier and a second multiple frequency band amplifier, for each amplified frequency band. To the output terminal of first vector adjuster 4a, there is connected the input terminal of a main amplifier 50a amplifying the frequency band of first vector adjuster 4a. To the output terminal of first vector adjuster 4b, there is connected the input terminal of a main amplifier 50b amplifying the operating frequency band of first vector adjuster 4b. To the output terminal of second vector adjuster 11a, there is connected the input terminal of an auxiliary amplifier 51a amplifying the operating frequency band of second vector adjuster 11a. To the output terminal of second vector adjuster 11b, there is connected the input terminal of an auxiliary amplifier 51b amplifying the operating frequency band of second vector adjuster 11b.

By providing a main amplifier and an auxiliary amplifier having frequency characteristics adapted to the operating frequency bands of the respective vector adjusters, it is in this way possible to use, in the present invention, an amplifier with a narrow amplified bandwidth. Further, it is also possible to replace first multiple frequency band amplifier 5 and second multiple frequency band amplifier 12, shown in FIG. 2, FIG. 4, and FIG. 5, with a plurality of amplifiers provided with operating frequency bands adapted to each of these frequency bands.

4. Fourth Embodiment

Figure 7:
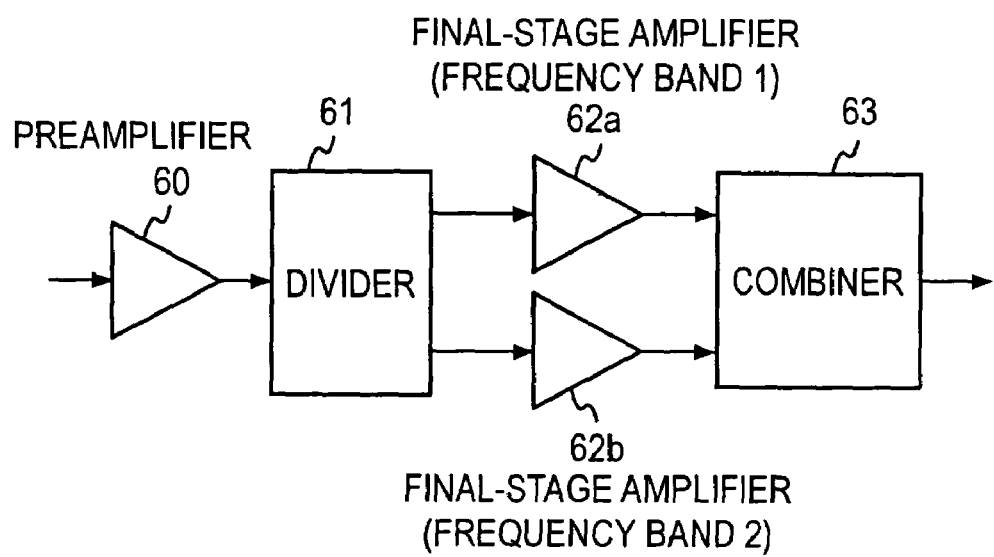
FIG. 7 is a diagram showing another configuration example of the first and second multiple frequency band amplifier.

Another configuration example of first multiple frequency band amplifier 5 and second multiple frequency band amplifier 12 is shown in FIG. 7. FIG. 7 is a diagram in which the amplifier is taken to have a two-stage configuration with a preamplifier 60 and final-stage amplifiers 62a and 62b. Final-stage amplifiers 62a and 62b are amplifiers with which a high gain can be obtained in the corresponding frequency bands. The first multiple frequency band amplifier or the preamplifier 60 of the second multiple frequency band amplifier amplifies the input signal. A divider 61 distributes the signal to the respective frequency bands. Final-stage amplifiers 62a and 62b amplify the signal of the corresponding frequency bands. A combiner 63 combines the amplified signals.

In addition, it is also possible to configure the main amplifier or the auxiliary amplifier with a single amplifier. In this case, there can be expected a cutback in the number of parts and a reduction in the power consumption of the amplifier as against when preparing an amplifier for each frequency band. Further, even in the case where the main amplifier and the auxiliary amplifier are constituted by single amplifiers, it is possible to provide a feed forward amplifier which adaptively selects the frequency band.

5. Fifth Embodiment

In the explanations given this far, frequency controlling part 9 was controlled by a control signal or the like from the operator. In the embodiments, there are shown examples in which, from a signal which is input to the feed forward amplifier, the frequency band of the input signal is automatically detected and the distortion component of the transmitted signal is compensated. In Embodiment 5, there is used a band detector 33, indicated with a dotted line in FIG. 2. In the case of this configuration, first divider 1 distributes a portion of the input signal to band detector 33 as well. Band detector 33, by the method shown below, detects the frequency band of the input signal and outputs a control signal to frequency controlling part 9. Other parts of the operation are the same as in Embodiment 1.

Figure 8:
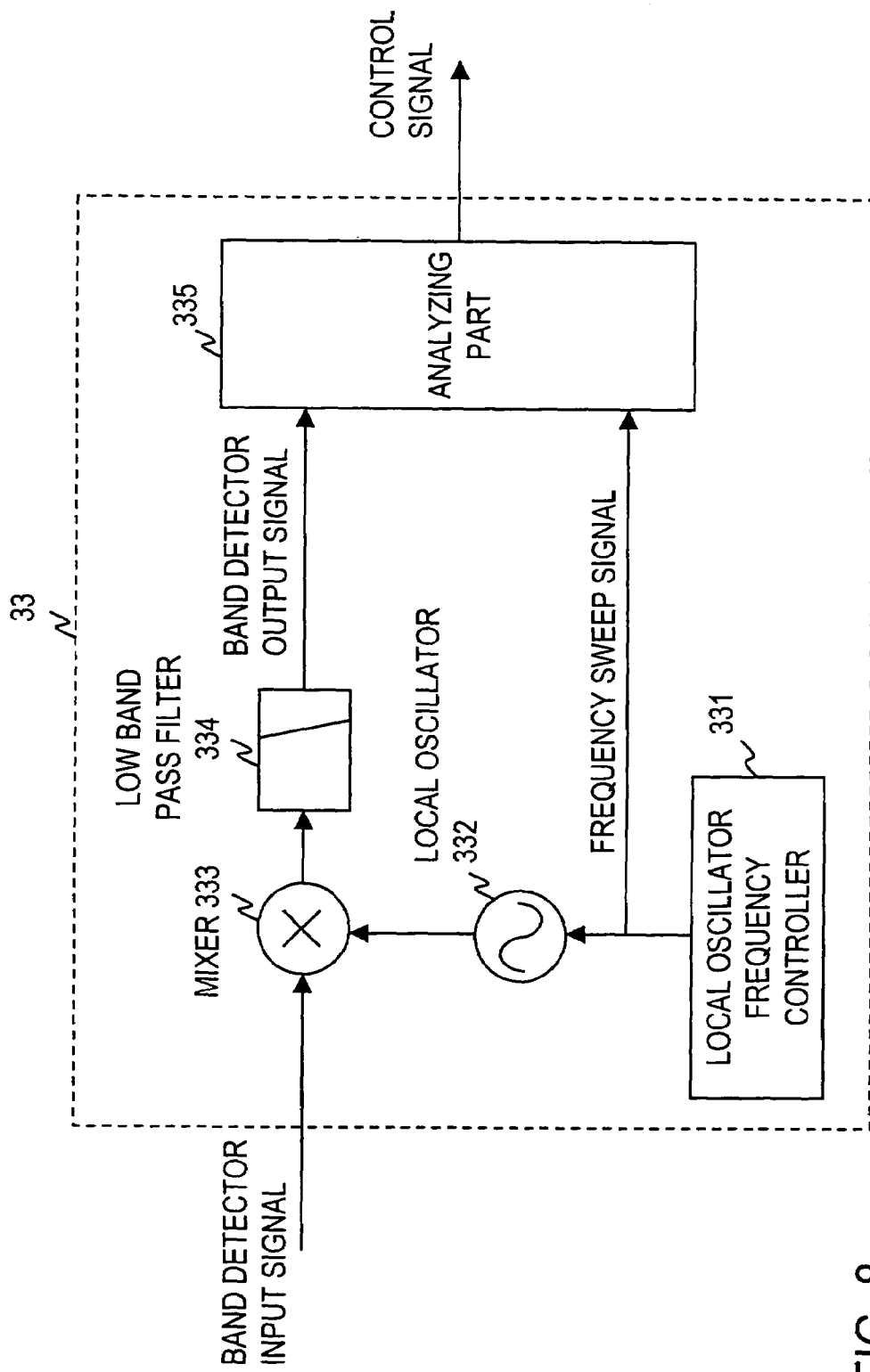
FIG. 8 is a diagram showing a functional configuration example of a band detector.

In FIG. 8, there is shown a functional configuration example of band detector 33. Band detector 33 is composed of a local oscillator frequency controlling part 331, a local oscillator 332, a mixer 333, a low band pass filter 334, and an analyzing part 335. Local oscillator frequency controlling part 331 controls local oscillator 332 so as to continuously sweep the frequency from the lower-limit frequency of the input signal to the upper-limit frequency. Following an instruction of local oscillator frequency controlling part 331, local oscillator 332 oscillates. Mixer 333 multiplies the input signal distributed from first divider 1 and the signal from local oscillator 332. The output signal from mixer 333 includes the frequency component of the difference of the frequency of the input signal and the frequency of the signal from local oscillator 332. In other words, in the case that the frequency of the input signal and the frequency of the signal from local oscillator 332 are very close, the near-DC component (the low-frequency component) is included in the output from mixer 333. Low band pass filter 334 only lets through the low-frequency component of the output from mixer 333. Consequently, only in the case that the frequency of the input signal and the frequency of the signal from local oscillator 332 are very close is the band detector output signal obtained from low band pass filter 334. Analyzing part 335 compares the frequency sweep signal from local oscillator frequency controlling part 331 with the band detector output signal from low band pass filter 334, detects the frequency band of the input signal, and outputs the control signal to frequency controlling part 9.

Figure 9:
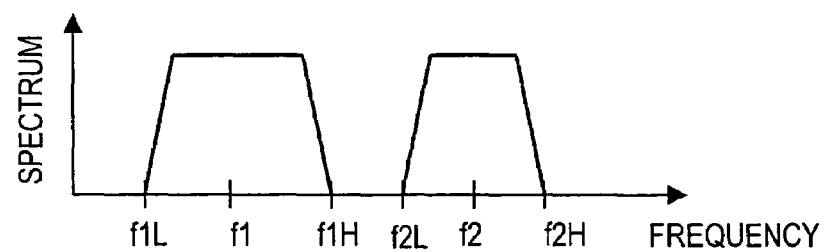
FIG. 9 is a diagram showing an example of the input signal spectrum of a feed forward amplifier.
Figure 10:
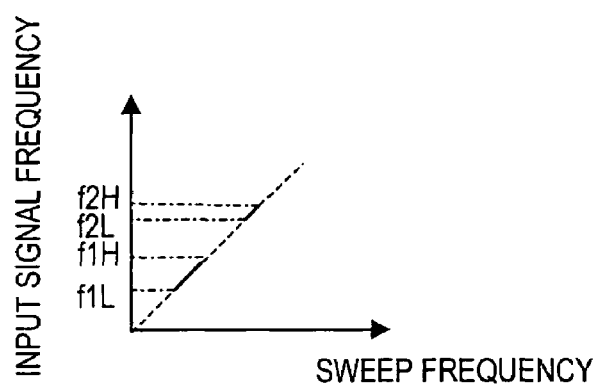
FIG. 10 is a diagram showing the relationship between the sweep frequency and the frequency of the input signal.
Figure 11:
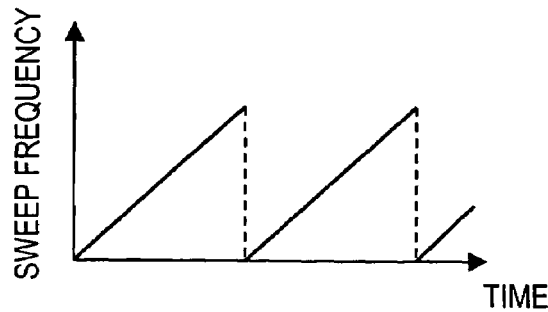
FIG. 11 is a diagram showing the time variation of the signal output from a local oscillator.
Figure 12:
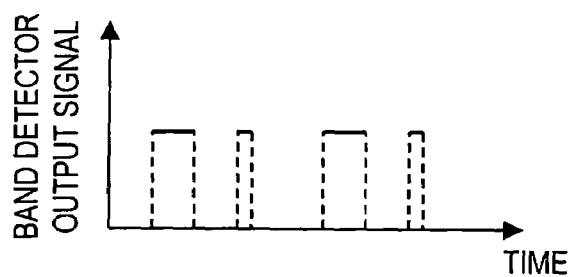
FIG. 12 is a diagram showing the time variation of the signal output from a low band pass filter.

In FIG. 9, there is shown an example of the input signal spectrum of a feed forward amplifier. The center frequency of the first frequency band is taken to be f11, the lower-limit frequency is taken to be f1L, and the upper-limit frequency is taken to be f1H. The center frequency of the second frequency band is taken to be f2, the lower-limit frequency is taken to be f2L, and the upper-limit frequency is taken to be f2H. In FIG. 10, the relationship between the sweep frequency and the input signal frequency is shown. The abscissa axis represents the sweep frequency and the ordinate axis represents the input signal frequency. This diagram shows that, in the case that the sweep frequency lies between frequency f1L and f1H, or between f2L and f2H, a near-DC signal from low band pass filter 334 is output. In FIG. 11, the time variation of the signal output from local oscillator 332 is shown. The abscissa axis represents time and the ordinate axis represents the output from local oscillator 332. In FIG. 12, the time variation of the output from low band pass filter 334 is shown. The abscissa axis represents time and the ordinate axis represents the power from low band pass filter 334. As shown in FIG. 12, in case the frequency of the output from local oscillator 332 corresponds to a range from frequency f1L to frequency f1H, or a range from frequency f2L to frequency f2H, the output from low band pass filter 334 is obtained.

Figure 13:
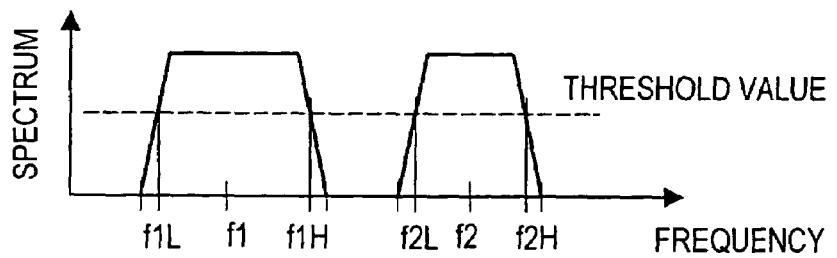
FIG. 13 is a diagram showing that, in the case that a threshold value is set for the output from the low band pass filter, the bandwidth of the detected frequency band becomes narrower.

Further, if a threshold value is set for the output from low band pass filter 334, the bandwidth of the frequency band becomes narrower, as shown in FIG. 13. Consequently, by multiplying, in analyzing part 335, the obtained lower-limit frequencies f1L and f2L and the upper-limit frequencies f1H and f2H by predetermined coefficients, each frequency may be corrected.

Also, local oscillator frequency controlling part 331 and analyzing part 335 can be implemented with an analog/digital converter and a microprocessor. As for local oscillator 332, generally used signal oscillators and the like may be used. Mixer 333 and low band pass filter 334 can be implemented with active filters using LC filters or operational amplifiers.

Since band detector 33 operates like this, the feed forward amplifier can respond adaptively even in the case where the input signal is changed dynamically. The time required to change the frequency band processed by the feed forward amplifier depends on the period of the signal swept by local oscillator 332. In case a high-speed frequency change is required, the period of the signal swept by local oscillator 332 may be shortened.

Further, band detector 33, as shown in FIG. 4, FIG. 5, and FIG. 6, can be utilized in all of the aforementioned embodiments. Whichever the embodiment is, it is possible to automatically detect the frequency band of the input signal if band detector 33 is used. And then, the configuration of the feed forward amplifier can be changed automatically via frequency controlling part 9.

As mentioned above, since the distortion compensated frequency band can be switched freely in the feed forward amplifier according to the present invention, it is possible to adaptively change the used frequency band in an environment where plural radio systems coexist. Accordingly, additional equipment to accompany a change in the frequency band or an increase in the number of carrier waves becomes unnecessary.

What is claimed is:

1. A band selection type feed forward amplifier, having a distortion detection circuit and a distortion elimination circuit, wherein said distortion detection circuit comprises:

a first linear signal path constituted by a first delay means;

a first vector adjustment path;

a first dividing part distributing an input signal to said first linear signal path and said first vector adjustment path;

n first vector adjusters provided in said first vector adjustment path and adjusting the phase and amplitude of signals in respectively different frequency bands;

a first switching means selecting one from among said n first vector adjusters and inserting the same into said first vector adjustment path;

a first multiple frequency band amplifier amplifying the output of said first vector adjusters; and a combiner/divider respectively outputting the additive component and the differential component of the output of said first linear signal path and the output of said first multiple frequency band amplifier;

wherein said distortion elimination circuit comprises:

a second linear signal path, constituted by a second delay means, into which said additive component is input;

a second vector adjustment path into which said differential component is input;

n second vector adjusters, provided in said second vector adjustment path and respectively adjusting the phase and amplitude of the signals in the same frequency bands as in said n first vector adjusters;

a second switching means selecting one from among said n second vector adjusters and inserting the same into said second vector adjustment path;

a second multiple frequency band amplifier amplifying the output of said second vector adjusters; and a second combining part combining and outputting the output of said second linear signal path and the output of said second multiple frequency band amplifier;

N being an integer equal to or greater than 2;

and comprising:

a frequency controlling part switching and controlling said first switching means and said second switching means.

2. The band selection type feed forward amplifier according to claim 1, characterized in that:

said first switching means comprises a first input switch inputting the output of said first divider into one first vector adjuster from among said n first vector adjusters and a first output switch inputting the output of said first vector adjuster into said first multiple frequency band amplifier; and said second switching means comprises a second input switch inputting the output of said combiner/divider into one second vector adjuster from among said n second vector adjusters and a second output switch inputting the output of said second vector adjuster into said second multiple frequency band amplifier.

3. The band selection type feed forward amplifier according to claim 1, characterized in that:

said first switching means comprises a first input switch inputting the output of said first divider into one first vector adjuster from among said n first vector adjusters and a first output combiner combining the output signals of said n first vector adjusters; and said second switching means comprises a second input switch inputting the output of said combiner/divider into one second vector adjuster from among said n second vector adjusters and a second output combiner combining the output signals of said n second vector adjusters.

4. The band selection type feed forward amplifier according to claim 1, characterized in that:

said first switching means comprises a first switching divider dividing the signal which is input from said first divider into n signals;

n first frequency band extractors: capable of respectively extracting, from said n distributed signals, signals of the frequency bands which can be adjusted by said n first vector adjusters and outputting the extracted signals to said first vector adjusters; and a first output combiner combining the output signals of said n first vector adjusters;

said second switching means comprises a second switching divider dividing the signal which is input from said combiner/divider into n signals;

n second frequency band extractors capable of respectively extracting, from said n distributed signals, signals of the frequency bands which can be adjusted by said n second vector adjusters and outputting the extracted signals to said second vector adjusters; and a second output combiner combining the output signals of said n second vector adjusters; and said frequency controlling part selecting one each from among said n first frequency band extractors and said n second frequency band extractors to bring the same into operation.

5. The band selection type feed forward amplifier according to any of claims 1 to 4, also comprising a band detector and characterized in that:

said first dividing part distributes a portion of the input signal to said band detector as well; and said band detector has a local oscillator;

a local oscillator frequency controlling part controlling the frequency of said local oscillator;

a mixer multiplying the input signal from said first dividing part and the signal from said local oscillator;

a low band pass filter letting through only the low-frequency portion of the output of said mixer; and an analyzing part detecting the frequency band of said input signal from the signal by which said local oscillator frequency controlling part controls the local oscillator and the output signal of said low band pass filter and outputting a control signal to said frequency band controller.

* * * * *